(12) United States Patent
Hamano

(10) Patent No.: US 12,113,104 B2
(45) Date of Patent: Oct. 8, 2024

(54) SEMICONDUCTOR DEVICE

(71) Applicant: SUMITOMO ELECTRIC INDUSTRIES, LTD., Osaka (JP)

(72) Inventor: Koshi Hamano, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 101 days.

(21) Appl. No.: 17/645,843

(22) Filed: Dec. 23, 2021

(65) Prior Publication Data
US 2022/0310788 A1    Sep. 29, 2022

(30) Foreign Application Priority Data
Mar. 24, 2021   (JP) .................. 2021-049890

(51) Int. Cl.
*H01L 29/06*    (2006.01)
*H01L 29/08*    (2006.01)
*H01L 23/00*    (2006.01)

(52) U.S. Cl.
CPC ...... *H01L 29/0696* (2013.01); *H01L 29/0843* (2013.01); *H01L 24/48* (2013.01); *H01L 2224/48132* (2013.01)

(58) Field of Classification Search
CPC . H01L 29/0696; H01L 29/0843; H01L 24/48; H01L 2224/48132; H01L 29/20; H01L 24/06; H01L 24/05; H01L 2224/04042; H01L 2224/0603; H01L 2924/00014; H01L 24/49; H01L 29/41775; H01L 2224/48091; H01L 2224/49111; H01L 2224/4813; H01L 29/778; H01L 29/41725; H01L 21/768–76898; H01L 23/522–53295; H01L 2221/10–1094; H01L 29/42316; H10B 41/10; H10B 41/20; H10B 41/30; H10B 41/35; H10B 41/40; H10B 41/44; H10B 41/43; H10B 41/42; H10B 43/00; H10B 43/10; H10B 43/20;
(Continued)

(56) References Cited

U.S. PATENT DOCUMENTS

| 4,462,041 A * | 7/1984 | Glenn ............... H01L 29/4238 257/E29.12 |
| 2012/0091986 A1* | 4/2012 | Takemae .............. G05F 3/08 257/E27.06 |

FOREIGN PATENT DOCUMENTS

| JP | H11-150126 | 6/1999 |
| JP | 2011-035761 | 2/2011 |

* cited by examiner

*Primary Examiner* — Moin M Rahman
(74) *Attorney, Agent, or Firm* — IPUSA, PLLC

(57) ABSTRACT

A semiconductor device includes a gate interconnect, extending in a first direction, and configured to transmit an input signal, and a transistor including gate electrodes extending in a second direction perpendicular to the first direction, and spaced apart from one another, and connected to the gate interconnect, and source and drain regions alternately arranged along the first direction, so that each gate electrode is sandwiched between the source and drain region which are adjacent to each other. The semiconductor device also includes drain interconnects, arranged above the drain regions, and connected to the drain regions, respectively, an output interconnect, connected to the drain interconnects, and configured to transmit an output signal output from the drain regions, and stubs connected to the drain interconnects, respectively. At least one of the stubs is connected to one of the drain interconnects at an end opposite from the gate interconnect.

10 Claims, 13 Drawing Sheets

(58) Field of Classification Search
CPC ........ H10B 43/23; H10B 43/27; H10B 43/30;
H10B 43/35; H10B 51/00; H10B 51/10;
H10B 51/20; H10B 51/30; H10B 51/40;
H10B 51/50; H10B 53/10; H10B 53/20;
H10B 53/22; H10B 63/30; H10B 63/32;
H10B 63/34; H10B 63/80; H10B 63/84;
H10B 99/00; H10B 99/10; H10B 99/22;
H10B 20/30; H10B 20/34; H10B 20/40;
H10B 20/387; H10B 12/056; H10B
12/05; H10B 12/36; H10B 10/12; H10B
12/053

See application file for complete search history.

SEMICONDUCTOR DEVICE

CROSS-REFERENCE TO RELATED APPLICATIONS

This application is based upon and claims priority to Japanese Patent Application No. 2021-049890 filed on Mar. 24, 2021, the entire contents of which are incorporated herein by reference.

BACKGROUND OF THE INVENTION

1. Field of the Invention

The present disclosure relates to semiconductor devices.

2. Description of the Related Art

Generally, with respect to an amplifier which includes a transistor for amplifying a high-frequency (or radio frequency) signal, a matching circuit is connected to an output of the transistor to match impedances. For example, this type of matching circuit has one end of an inductor connected to the output of the transistor, and a short stub and an open stub are connected in parallel to the other end of the inductor. One example of this type of matching circuit is described in Japanese Laid-Open Patent Publication No. 2011-035761, for example.

In order to broaden the frequency band and improve the frequency characteristics of the amplifier, compensation of a drain-source capacitance of the transistor is required in order to minimize the effects of stray (or parasitic) capacitance. Conventionally, the inductor is added to the matching circuit which is connected to the output of the transistor, so as to compensate for the drain-to-source capacitance.

SUMMARY OF THE INVENTION

Accordingly, one object according to embodiments of the present disclosure is to provide a transistor which can compensate for the drain-source capacitance and improve the frequency characteristics, and a semiconductor device including the transistor.

According to one aspect of the present disclosure, a semiconductor device includes a gate interconnect, extending in a first direction, and configured to transmit an input signal; a first transistor including a plurality of gate electrodes extending in a second direction perpendicular to the first direction, and spaced apart from one another, and connected to the gate interconnect, and a plurality of source regions and a plurality of drain regions which are alternately arranged along the first direction, so that each gate electrode of the plurality of gate electrodes is sandwiched between the source region and the drain region which are adjacent to each other; a plurality of drain interconnects, arranged above the plurality of drain regions, and connected to the plurality of drain regions, respectively; an output interconnect, connected to the plurality of drain interconnects, and configured to transmit an output signal output from the plurality of drain regions; and a plurality of stubs connected to the plurality of drain interconnects, respectively, wherein at least one stub of the plurality of stubs is connected to one drain interconnect of the plurality of drain interconnects at an end opposite from the gate interconnect.

Other objects and further features of the present disclosure will be apparent from the following detailed description when read in conjunction with the accompanying drawings.

DETAILED DESCRIPTION

Figure 1:
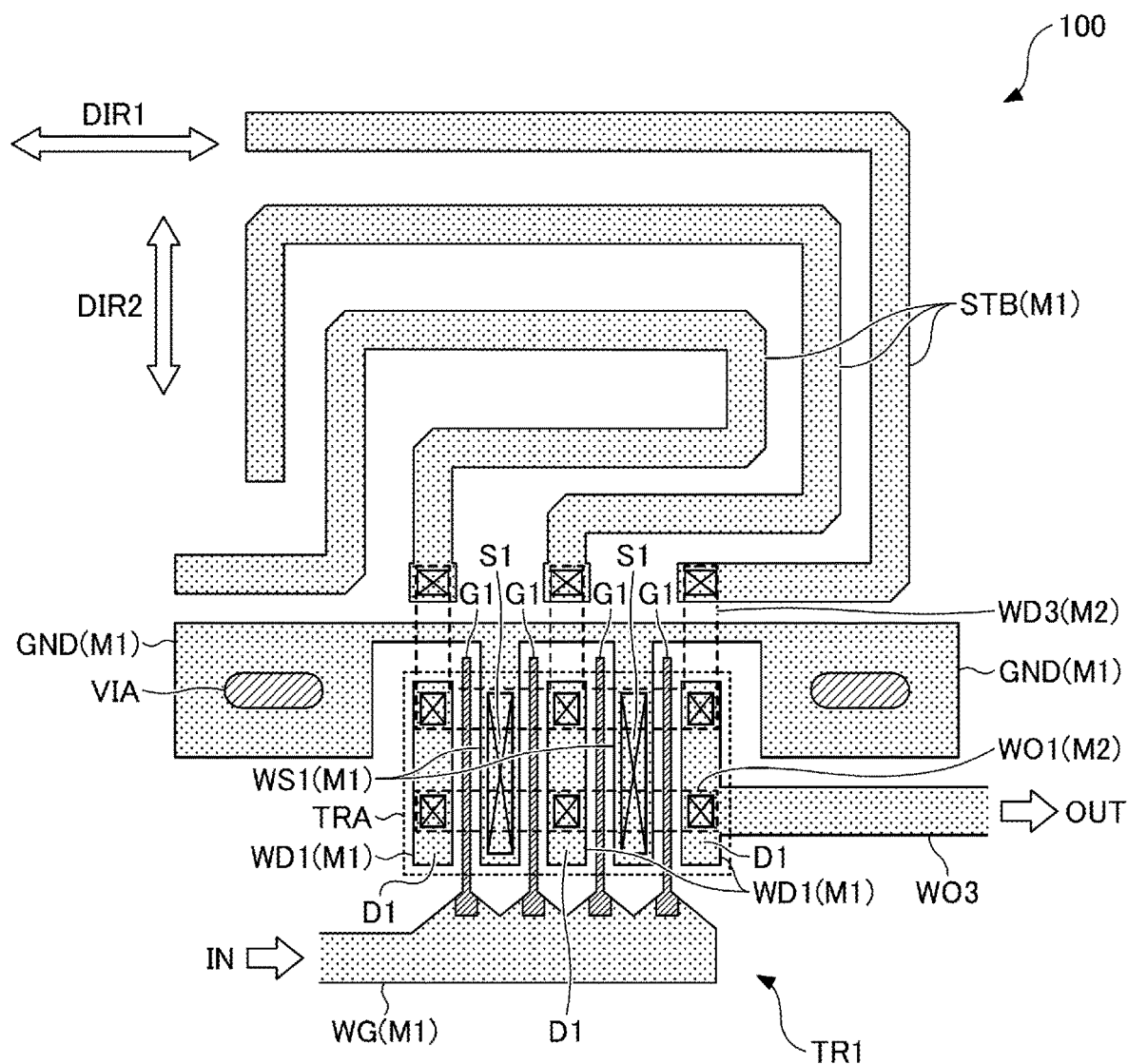
FIG. 1 is a layout diagram illustrating an example of a circuit configuration of a semiconductor device according to a first embodiment.

In order to efficiently compensate for the drain-source capacitance of the transistor for amplifying a high-frequency (or radio frequency) signal, included in the amplifier, it is preferable to provide a compensation circuit inside or near the transistor, rather than in the matching circuit.

Accordingly, the present disclosure provides a transistor which can compensate for the drain-source capacitance and improve the frequency characteristics, and a semiconductor device including the transistor.

Embodiments of the present disclosure are described below.

[1] A semiconductor device according to one aspect of the present disclosure may include a gate interconnect, extending in a first direction, and configured to transmit an input signal; a transistor including a plurality of gate electrodes extending in a second direction perpendicular to the first direction, and spaced apart from one another, and connected to the gate interconnect, and a plurality of source regions and a plurality of drain regions which are alternately arranged along the first direction, so that each gate electrode of the plurality of gate electrodes is sandwiched between the source region and the drain region which are adjacent to each other; a plurality of drain interconnects, arranged above the plurality of drain regions, and connected to the plurality of drain regions, respectively; an output interconnect, connected to the plurality of drain interconnects, and configured to transmit an output signal output from the plurality of drain regions; and a plurality of stubs connected to the plurality of drain interconnects, respectively, wherein at least one stub of the plurality of stubs is connected to one drain interconnect of the plurality of drain interconnects at an end opposite from the gate interconnect.

In this semiconductor device, by connecting at least one stub to one of the drain interconnects at the end opposite from the gate interconnect, it is possible to efficiently compensate for (or cancel) the drain-source capacitance of the transistor compared to the case where the stub is provided in the matching circuit connected to the output of the transistor. In this case, by connecting the stub to the drain interconnect from the side opposite to the gate interconnect, it is possible to improve the ease of the connection, and improve the degree of freedom of the layout of the stub.

[2] In the semiconductor device [1] above, the plurality of drain interconnects may be provided using a first metal interconnect layer, and the stub may be provided using at least one of the first metal interconnect layer and a second metal interconnect layer provided above the first metal interconnect layer. In this case, the drain interconnect and the stub can be connected across other interconnections provided using the first metal interconnect layer, for example.

[3] The semiconductor device [2] above may further include a plurality of source interconnects arranged above the plurality of source regions, and connected to the source regions, respectively, and the output interconnect may extend across at least one of the plurality of source interconnects and at least one of the plurality of gate electrodes of the first transistor along the first direction, and be connected to each of the plurality of drain interconnects. In this case, because the output interconnect can be arranged without being rerouted to take alternative routes around the transistor, it is possible to minimize the wiring resistance and the stray capacitance of the output interconnect. Accordingly, the frequency characteristics of the output signal can be improved compared to the case where the output interconnect is rerouted to take alternative routes around the transistor.

[4] In the semiconductor device [3] above, the output interconnect may be famed using a metal interconnect layer provided above another metal interconnect layer used to foam the plurality of source interconnects and the plurality of drain interconnects. In this case, because an insulating film is not provided under the output interconnect, it is possible to reduce the wiring load, and improve the high frequency characteristics.

[5] The semiconductor device [4] above may further include a second transistor having a structure identical to the first transistor, wherein the first transistor and the second transistor may be arranged on both sides of the gate interconnect along the second direction; and an interconnect combining part configured to connect the output interconnect of the first transistor, connected to the plurality of drain regions through the plurality of drain interconnects of the first transistor, and an output interconnect of the second transistor, connected to a plurality of drain regions through a plurality of drain interconnects of the second transistor. By connecting the output interconnects to the interconnect combining part without rerouting to take alternative routes around the two transistors, it is possible to shorten the electrical length of the interconnect combining part. As a result, it is possible to reduce the impedance and the loss of the output signal, and increase the output power of the semiconductor device having the frequency characteristics improved by the open stub. Further, it is possible to reduce the circuit size of the matching circuit connected to the interconnect combining part, and reduce the size of the semiconductor device.

[6] In the semiconductor device [4] or [5] above, a plurality of stubs may be connected to the plurality of the drain interconnects, respectively. In this case, the stray capacitances of the plurality of stubs can be made the same, and the inductances of the plurality of stubs can be made the same, by making the wiring lengths the same in the layout design. As a result, the impedances of the subtransistors formed for each gate electrode can be made the same in the transistor, and thus, it is possible to prevent deterioration of the frequency characteristics of the output signal.

[7] The semiconductor device [4] or [5] above may further include a dummy interconnect arranged outside of the first transistor at a first end of the output interconnect, opposite a second end of the output interconnect toward which the output signal is transmitted in the output interconnect, wherein the second end of the output interconnect may extend to the outside of the transistor and connect to the dummy interconnect. In this case, it is possible to compensate for the symmetry of the stray capacitance of the output interconnect connected to each drain region through each drain interconnect. A plurality of such a compensation circuit, which makes the impedance of each drain electrode uniform and reduces the impedance mismatch, such as a multi-finger type or a fish-bone type, may be provided. As a result, the proposed transistor shape or design can improve the output power and the gain.

[8] In the semiconductor device [4] or [5] above, each stub of the plurality of stubs may be routed without intersecting other signal interconnects. In this case, the stub can be famed using the interconnect of only one metal interconnect layer. As a result, the electrical characteristics of the plurality of stubs, such as the stray capacitance or the inductance, can easily be made the same.

[9] In the semiconductor device [8] above, a wiring length, a wiring width, and a wiring material of the plurality of stubs may be respectively the same among the plurality of stubs. As a result, the electrical characteristics of the plurality of stubs, such as the stray capacitance or the inductance, can easily be made the same.

[10] In the semiconductor device [4] or [5] above, the output interconnect may be arranged on a side of the gate interconnect of the first transistor. In this case, it is possible to further reduce the electrical length, the wiring resistance, and the stray capacitance of the output interconnect.

DETAILS OF EMBODIMENTS OF PRESENT DISCLOSURE

Specific examples of the semiconductor device of the present disclosure will be described in the following, with reference to the drawings. The present disclosure is not limited to the embodiments described in the following. For example, the number of gate electrodes provided in one transistor region TRA may be at least two, and is not limited to the number illustrated in each of the figures.

First Embodiment

<Layout of Semiconductor Device>

FIG. 1 is a layout diagram illustrating an example of a circuit configuration of the semiconductor device according to a first embodiment. For example, a semiconductor device 100 illustrated in FIG. 1 is mounted in a broadband amplifier for an extremely high frequency band on the order of several tens of GHz to several hundred GHz, and is used to amplify the power of a high-frequency signal.

The semiconductor device 100 includes a transistor TR1, which amplifies a high-frequency input signal supplied to a common input terminal IN, and outputs the amplified, high-frequency output signal from a common output terminal OUT. The transistor TR1 is formed in a transistor region TRA represented by a rectangular region indicated by a dashed line. For example, the transistor TR1 is a gallium nitride high electron mobility transistor (GaN HEMI). Alternatively, the transistor TR1 may be a GaAs transistor.

The transistor TR1 has four gate electrodes G1 extending in a direction DIR2 perpendicular to a direction DIR1 in which a gate interconnect WG for transmitting an input signal extends. The four gate electrodes G1 are spaced apart from one another, and are connected to the gate interconnect WG. In addition, the transistor TR1 has source regions S1 and drain regions D1 which are alternately arranged along the direction DIR1, so that each of the four gate electrodes G1 is sandwiched between the source region S1 and the drain region D1 which are adjacent to each other. The direction DIR1 is an example of a first direction, and the direction DIR2 is an example of a second direction.

For example, the gate electrodes G1 are formed using a first metal interconnect layer M1. The first metal interconnect layer M1 is a metal interconnect layer closest to a semiconductor substrate on which the semiconductor device 100 is formed. In the example illustrated in FIG. 1, the drain regions D1 are formed at both ends along the direction DIR1 of the transistor region TRA where the transistor TR1 is formed. In addition, the transistor TR1 has three drain regions D1, and two source regions S1, which are arranged so that the drain region D1 and the source region S1 are alternately arranged along the direction DIR1.

A drain interconnect (drain electrode) WD1, which is formed using the first metal interconnect layer M1, is directly connected to the drain region D1. A source interconnect (source electrode) WS1, which is formed using the first metal interconnect layer M1, is directly connected to the source region S1. In each of the figures, a rectangular area marked with a cross (or "X") indicates a connection portion connecting an interconnect which is formed using the first metal interconnect layer M1 and an interconnect which is famed using the second metal interconnect layer M2.

Each source interconnect WS1, which is formed on the source region S1, is directly connected to a ground pattern GND at an end opposite from the gate interconnect WG along the direction DIR2. The source interconnects WS1 and the ground pattern GND are integrally formed using the first metal interconnect layer M1. In addition, the ground pattern GND is connected to a ground pattern which is formed on the entire back surface of the substrate of the semiconductor device 100, through vias VIA.

Each drain interconnect WD1 is connected to an output interconnect WO1 extending in the direction DIR1, in the drain region D1. The output interconnect WO1 is formed using the second metal interconnect layer M2, and is connected to each drain interconnect WD1 on the side of the gate interconnect WG. The second metal interconnect layer M2 is a metal interconnect layer which is provided above the first metal interconnect layer M1 in the semiconductor device 100.

The output interconnect WO1, which is connected to the drain interconnects WD1, is famed across the source interconnects WS1 and the gate electrodes G1, and is connected to an output interconnect WO3. The output interconnect WO1 enables each drain interconnect WD1 to be connected to the output interconnect WO3 at linearly arranged connection portions. Because the output interconnect WO1 can be arranged with a layout without having to take alternative routes around the gate electrodes G1 and the source interconnects WS1, it is possible to minimize added stray components, such as the wiring resistance, the wiring capacitance, or the like of the output interconnects WO1 and WO3 through which the output signal of the transistor TR1 is transmitted. As a result, it is possible to improve the frequency characteristics of the output signal compared to a case where the output interconnects are rerouted to take alternative routes around the transistor.

Each drain interconnect WD1 is directly connected to the output interconnect WO3 which is formed using the first metal interconnect layer M1, on the side (the right in FIG. 1) of the output terminal OUT. Further, each drain interconnect WD1 is electrically connected to the output terminal OUT through the output interconnect WO3.

Each drain interconnect WD1 is connected to an E-shaped drain interconnect WD3 which is formed using the second metal interconnect layer M2, at the end opposite from the gate interconnect WG. The drain interconnect WD3 has three protruding portions at positions corresponding to the drain interconnects WD1, and the three protruding portions protrude in an opposite direction to the gate interconnect WG across the ground pattern GND. Tip ends of the three protruding portions are connected to the open stubs STB which are formed using the first metal interconnect layer M1, respectively. In other words, the open stubs STB are connected to the drain interconnects WD1, respectively, at the end opposite from the gate interconnect WG.

Each open stub STB may be defined to include the protruding portion of the drain interconnect WD3. The open stubs STB are routed without intersecting other signal interconnects. The ground pattern GND, which is grounded, is not included in the other signal interconnects. In addition, the open stubs STB do not intersect each other. Hence, it is possible to improve the connection ease of the open stubs STB which are connected to the drain interconnects WD1, and improve the degree of freedom of the stub layout. In other words, it is possible to facilitate the layout design of the open stubs STB.

The open stubs STB, which are formed using the second metal interconnect layer M2, may respectively be directly connected to the protruding portions of the drain interconnect WD3, which is formed using the second metal interconnect layer M2. By reducing connections between the first and second metal interconnect layers M1 and M2, it is possible to further facilitate the layout design of the open stubs STB.

The length of each open stub STB is designed to be greater than or equal to ¼ of a wavelength $\lambda$ (that is, $\lambda/4$) of the output signal output from the transistor TR1. Hence, the open stubs STB can function as inductor components and efficiently compensate for a drain-source capacitance of the transistor TR1. In other words, the open stub STB, which appears inductive when viewed from each drain electrode WD1, can efficiently compensate for the drain-source capacitance of the transistor TR1. Moreover, the wiring length, the wiring width, and the wiring material are the same among the open stubs STB. Hence, the stray capacitances can easily be made the same among the open stubs STB, and the inductances can easily be made the same among the open stubs STB. As an example, the semiconductor device 100 may be manufactured using a compound semiconductor having a relative dielectric constant in a range of approximately 9 to approximately 12, such as a gallium nitride (GaN) layer, an aluminum gallium nitride (AlGaN) layer, or the like, and the frequency band of the output signal may be 80 GHz. In this case, λ/4 is approximately 350 μm.

Due to the ground pattern formed on the entire back surface of the substrate of the semiconductor device 100, the open stubs STB have a micro-stripline structure. Short stubs may be provided in place of the open stubs STB. In addition, the semiconductor device 100 may be mounted in a broadband amplifier for a microwave band on the order of several GHz to several tens of GHz. In this case, the length of each open stub STB is designed to be longer than the open stub STB illustrated in FIG. 1, so that the length of each open stub STB becomes greater than or equal to ¼ of the wavelength λ (that is, λ/4) of the output signal output from the transistor TR1.

In FIG. 1, the source interconnects WS1 and the ground pattern GND are integrally formed using the first metal interconnect layer M1. However, the connection between the source interconnects WS1 and the ground pattern GND may be made through ground interconnects formed in the second metal interconnect layer M2. In this case, the ground interconnects of the second metal interconnect layer M2 are formed along the direction DIR1, between the drain interconnects WD3 and the output interconnect WO1.

Further, the ground interconnects of the second metal interconnect layer M2 extend to the ground pattern GND, and are connected to the ground pattern GND. For this reason, similar to FIG. 11 which will be described later, each open stub STB can be integrally formed with each drain interconnect WD1, using only the first metal interconnect layer M1. As a result, it is possible to facilitate the layout design of the open stubs STB compared to a case where the open stubs STB are formed using the second metal interconnect layer M2.

[Airbridge Interconnect Structure of Output Interconnect]

Figure 2:
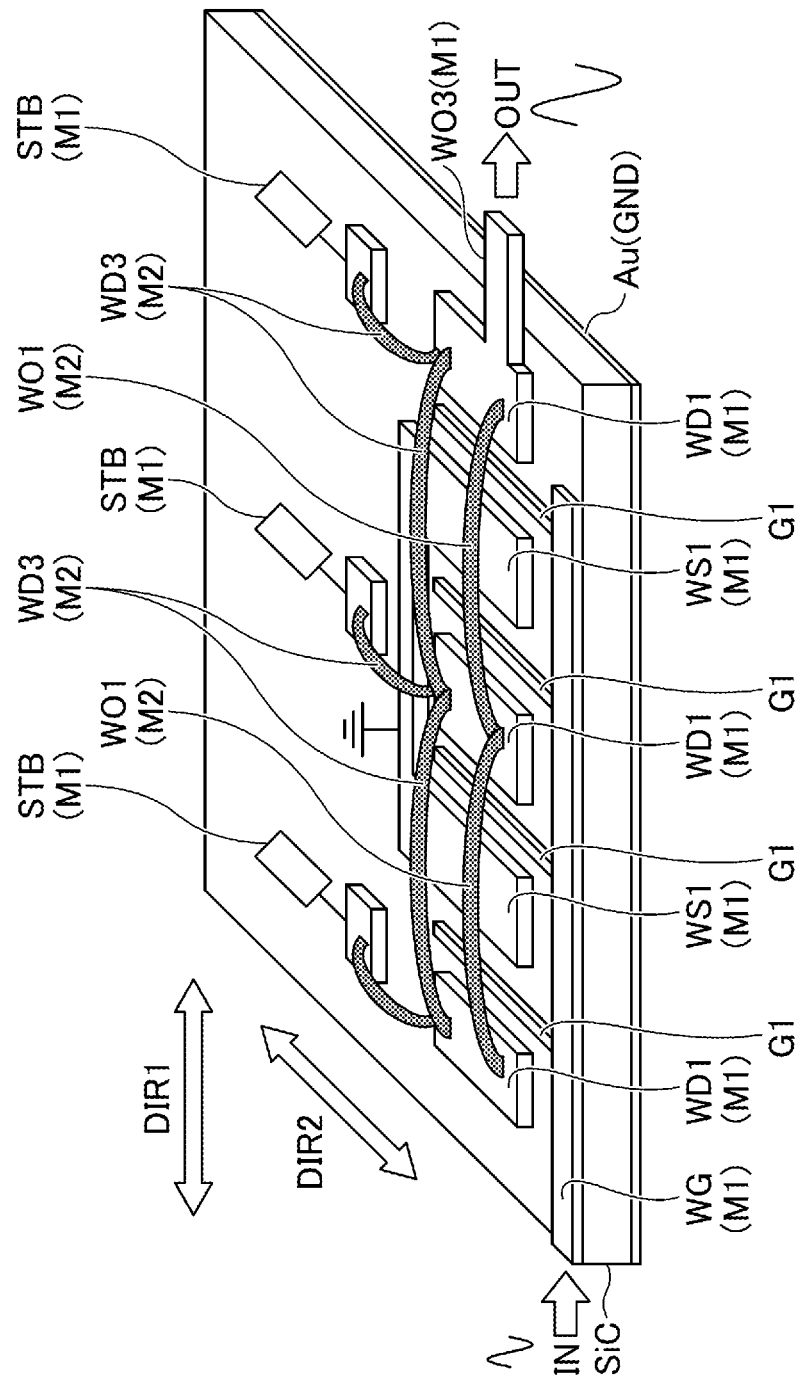
FIG. 2 is a perspective view generally illustrating the semiconductor device illustrated in FIG. 1.

FIG. 2 is a perspective view generally illustrating the semiconductor device 100 illustrated in FIG. 1. Each drain region D1 is connected to the output interconnect WO3 through the drain interconnect WD1 and the output interconnect WO1 having an airbridge interconnect structure. For this reason, an air gap is formed between the output interconnect WO1, and each of the gate electrodes G1 and the source interconnects WS1 opposing the output interconnect WO1. Because an insulating film is not provided under the output interconnect WO1, it is possible to reduce the wiring load, and improve the high frequency characteristics.

For example, the semiconductor device 100 includes a gallium nitride layer, an aluminum gallium nitride layer, and a gallium nitride layer laminated on a silicon carbide (SiC) substrate. A gold (Au) film is formed as the ground pattern on the entire the back surface of the silicon carbide substrate.

Using the first metal interconnect layer M1, the gate electrodes G1, the source interconnects WS1, and the drain interconnects WD1 are formed above the uppermost gallium nitride layer. For example, the gate electrodes G1, the source interconnects WS1, the drain interconnects WD1, and the open stub STB are formed of gold (Au).

The gate electrodes G1 make Schottky contact with the gallium nitride layer. The gate electrodes G1 may have a recessed structure. In the transistor region TRA, the source interconnects WS1 and the drain interconnects WD1 make ohmic contact with the gallium nitride layer.

<Equivalent Circuit of Semiconductor Device>

Figure 3:
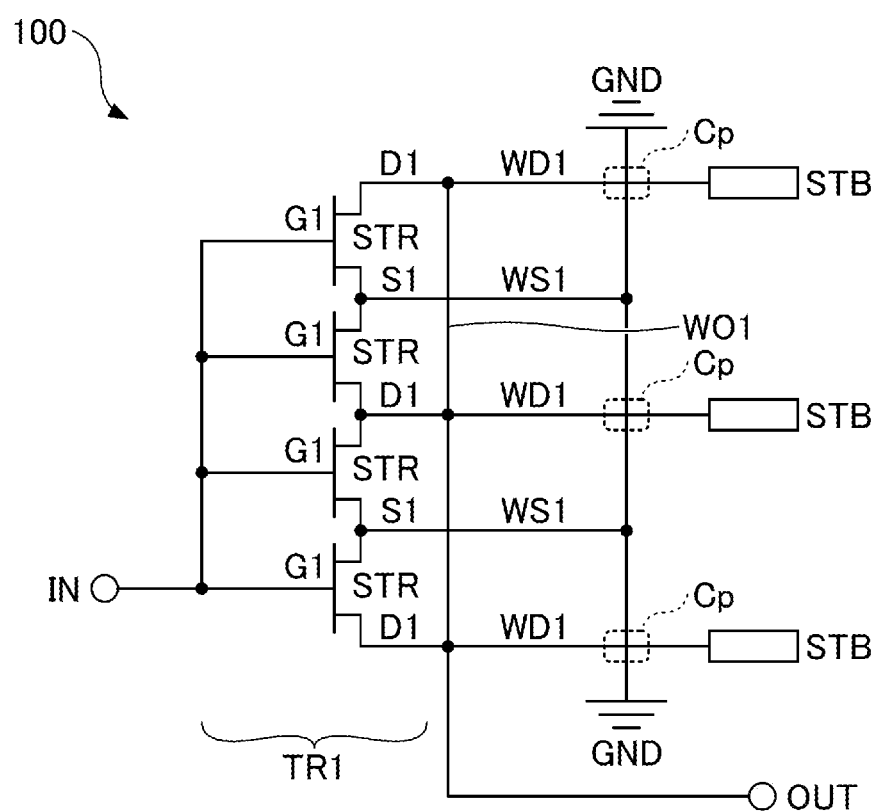
FIG. 3 is an equivalent circuit diagram of the semiconductor device illustrated in FIG. 1.

FIG. 3 is an equivalent circuit diagram of the semiconductor device 100 illustrated in FIG. 1. In FIG. 3, four transistors formed with respect to the four gate electrodes G1, will be referred to as subtransistors STR. In this embodiment, among the four subtransistors STR, each of the two central subtransistors STR has a source region S1 shared by a drain region D1 of the adjacent subtransistor STR, and a drain region D1 shared by a source region S1 of the adjacent subtransistor STR.

As illustrated in FIG. 1, the drain interconnects WD1 are connected to the open stubs STB, respectively, across the ground pattern GND. For this reason, line (or line-to-line) capacitances Cp are formed between the protruding portions of the drain interconnects WD3 (the second metal interconnect layer M2) which are connected to the open stubs STB, respectively, and the ground pattern GND (the first metal interconnect layer M1). However, because the structures connecting the drain interconnects WD1 and the open stubs STB are all the same, the line capacitances Cp are all the same. Hence, the inductances of the open stubs STB can all be made the same, and it is possible to prevent the characteristics of the transistor TR1 from deteriorating due to the differences among the inductances of the open stubs STB.

[Equivalent Circuit of Gallium Nitride High Electron Mobility Transistor]

Figure 4:
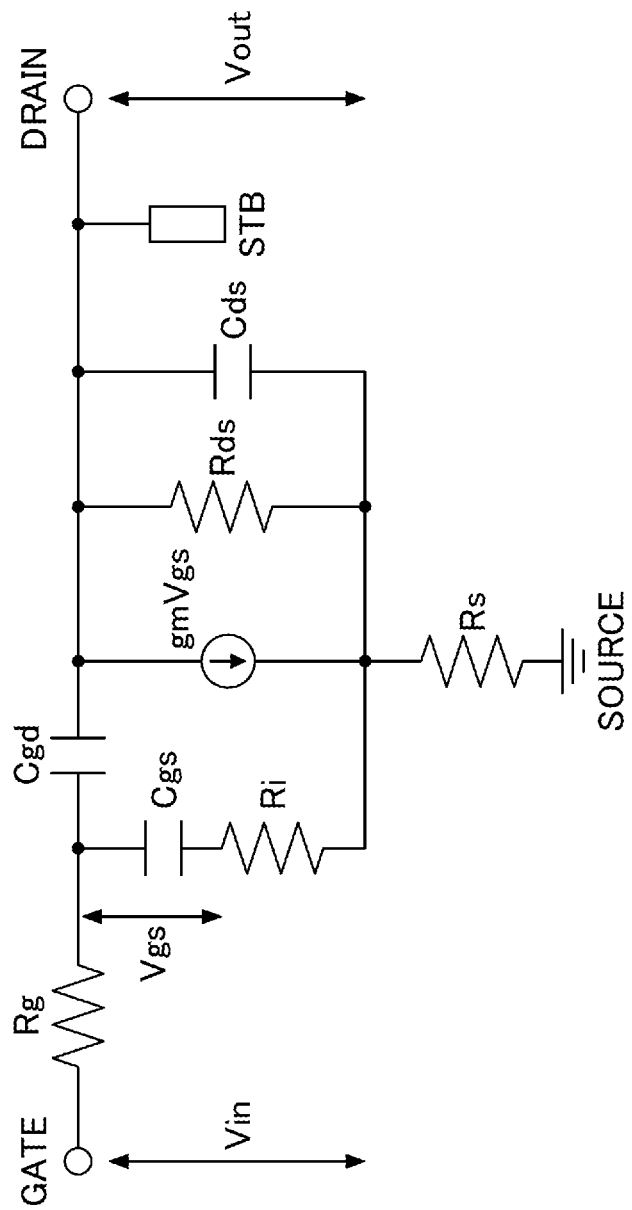
FIG. 4 is an equivalent circuit diagram of a gallium nitride high electron mobility transistor having an open stub.

FIG. 4 is an equivalent circuit diagram of a gallium nitride high electron mobility transistor having the open stub STB. In FIG. 4, symbols Rg, Rs, Rds, and Ri denote a gate resistance, a source resistance, a drain-source resistance, and an internal resistance, respectively. Symbols Cgd, Cgs, and Cds denote a gate-drain capacitance, a gate-source capacitance, and a drain-source capacitance, respectively. A symbol gmVgs denotes a drain current (current source).

Broadening the frequency band of the transistor requires compensation of the drain-source capacitance Cds. Typically, compensation of the drain-source capacitance Cds is performed by a matching circuit externally connected to the transistor. However, in order to further improve the effects of the compensation, it is preferable that the compensation of the drain-source capacitance Cds is performed by the transistor itself, or near the transistor. For this reason, in this embodiment, the open stub STB that is provided is directly connected to the drain of the transistor.

[Communication System Including Semiconductor Device]

Figure 5:
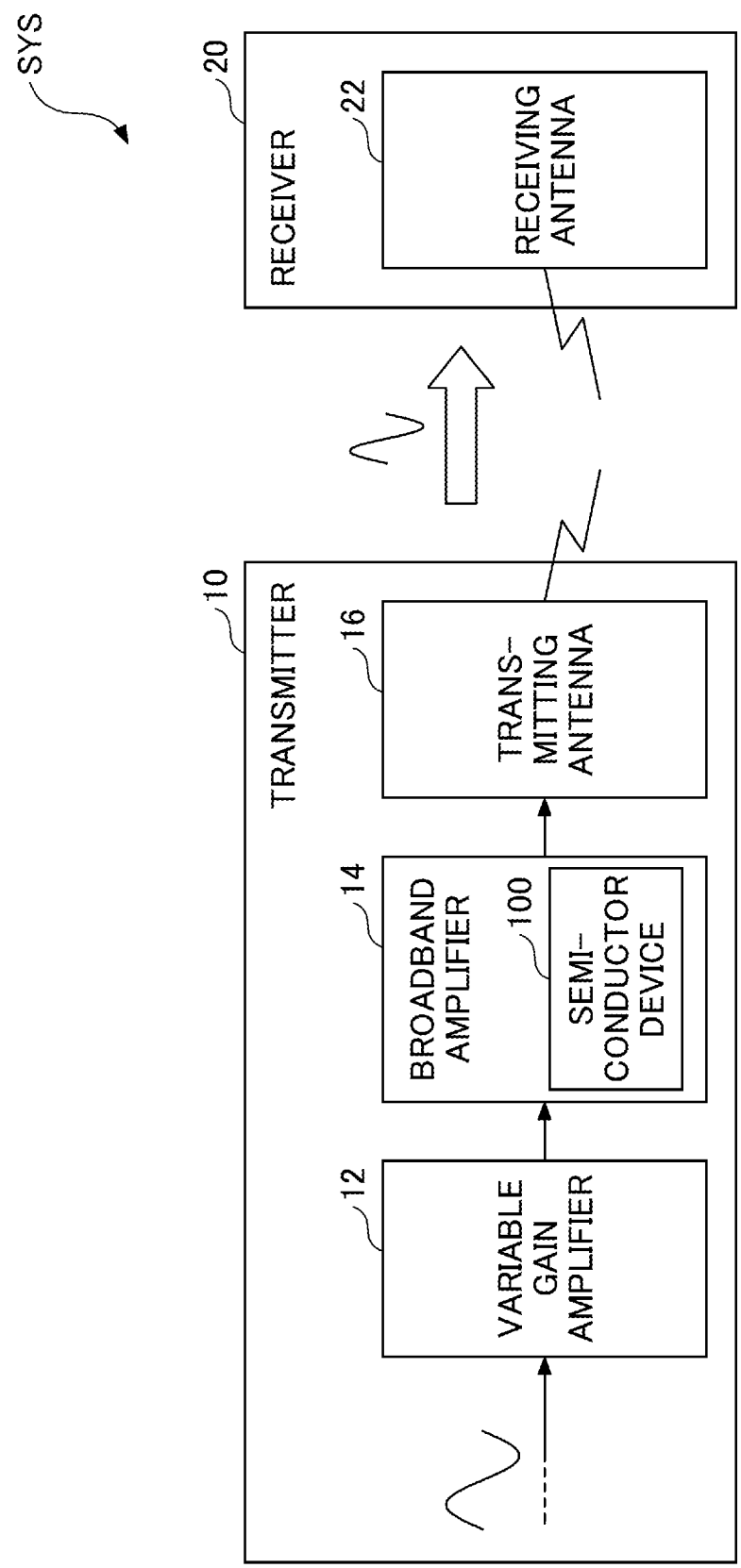
FIG. 5 is a diagram illustrating an example of a system configuration of a communication system including a broadband amplifier, and the semiconductor device illustrated in FIG. 1 included in the broadband amplifier.

FIG. 5 is a diagram illustrating an example of a system configuration of a communication system SYS including a broadband amplifier 14, and the semiconductor device 100 illustrated in FIG. 1 included in the broadband amplifier 14. The communication system SYS includes a transmitter 10 configured to perform radio transmission of high-frequency (or radio frequency) signals, and a receiver 20 configured to perform radio reception of the high-frequency (or radio frequency) signals transmitted from the transmitter 10. For example, the transmitter 10 and the receiver 20 are provided in a mobile base station (MBS).

The transmitter 10 includes a variable gain amplifier 12, a broadband amplifier 14, and a transmitting antenna 16. The receiver 20 includes a receiving antenna 22, and a receiving circuit which is not illustrated. The variable gain amplifier 12 generates an output signal by varying the gain of an input signal according to a control voltage, and outputs the generated output signal to the broadband amplifier 14.

The broadband amplifier 14 amplifies the power of the signal received from the variable gain amplifier 12, and outputs the power-amplified signal to the transmitting antenna 16. The transmitting antenna 16 converts the electrical signal received from the broadband amplifier 14 into radio waves, and transmits the radio waves toward the receiver 20. The receiving antenna 22 of the receiver 20 receives the radio waves from the transmitter 10, and a signal processing is performed on the received radio waves by the receiving circuit of the receiver 20.

The broadband amplifier 14 includes the semiconductor device 100 in which the open stubs STB are directly connected to the drain interconnects WD1. For this reason, it is possible to improve the frequency characteristics of the radio signals transmitted from the transmitter 10.

As described above, in this embodiment, the open stub STB is directly connected to each drain interconnect (drain electrode) WD1 connected to each drain region D1 of the transistor TR1. In other words, the open stub STB is connected to the transistor TR1, on the side closer to the transistor TR1 than the output interconnect WO3 through which the output signal from the transistor TR1 is transmitted. Accordingly, compared to the case where the open stub STB is provided in the matching circuit which is connected to the output of the transistor TR1, it is possible to more efficiently compensate for the drain-source capacitance of the transistor TR1.

The open stubs STB can be provided without intersecting (or traversing) other signal interconnects. In addition, the wiring length, the wiring width, and the wiring material can be designed to be the same among the open stubs STB. Hence, the stray capacitances can be made the same among the open stubs STB, and the inductances can be made the same among the open stubs STB. In other words, the electrical characteristics can be made the same among the open stubs STB. By making the stray capacitances the same and the inductances the same among the open stubs STB, it is possible to match the impedances of the subtransistors STR respectively formed for each of the gate electrodes G1, and prevent deterioration of the frequency characteristics of the output signal of the transistor TR1.

By making the wiring length, the wiring width, and the wiring material the same among the open stubs STB, it is possible to easily make the stray capacitances the same among the open stubs STB, and easily make the inductances the same among the open stubs STB.

The output interconnect WO1, which is connected to the drain interconnects WD1, is formed across the source interconnects WS1 and the gate electrodes G1, and is connected to an output interconnect WO3. The output interconnect WO1 enables each drain interconnect WD1 to be connected to the output interconnect WO3 at linearly arranged connection portions. Because the output interconnect WO1 can be arranged with a layout without having to take alternative routes around the gate electrodes G1 and the source interconnects WS1, it is possible to minimize the wiring resistance and the stray capacitance of the output interconnects WO1 and WO3, and improve the frequency characteristics of the output signal.

The length of each open stub STB is designed to be greater than or equal to ¼ of the wavelength A (that is, $\lambda/4$) of the output signal output from the transistor TR1. Hence, the open stubs STB can function as inductor components and efficiently compensate for the drain-source capacitance of the transistor TR1. In other words, the open stub STB, which appears inductive when viewed from each drain electrode WD1, can efficiently compensate for the drain-source capacitance of the transistor TR1.

The broadband amplifier 14 provided in the transmitter 10 includes the semiconductor device 100, which includes the open stubs STB directly connected to the drain interconnects WD1, respectively. For this reason, it is possible to improve the frequency characteristics of the radio signal transmitted from the transmitter 10.

Second Embodiment

<Layout of Semiconductor Device>

Figure 6:
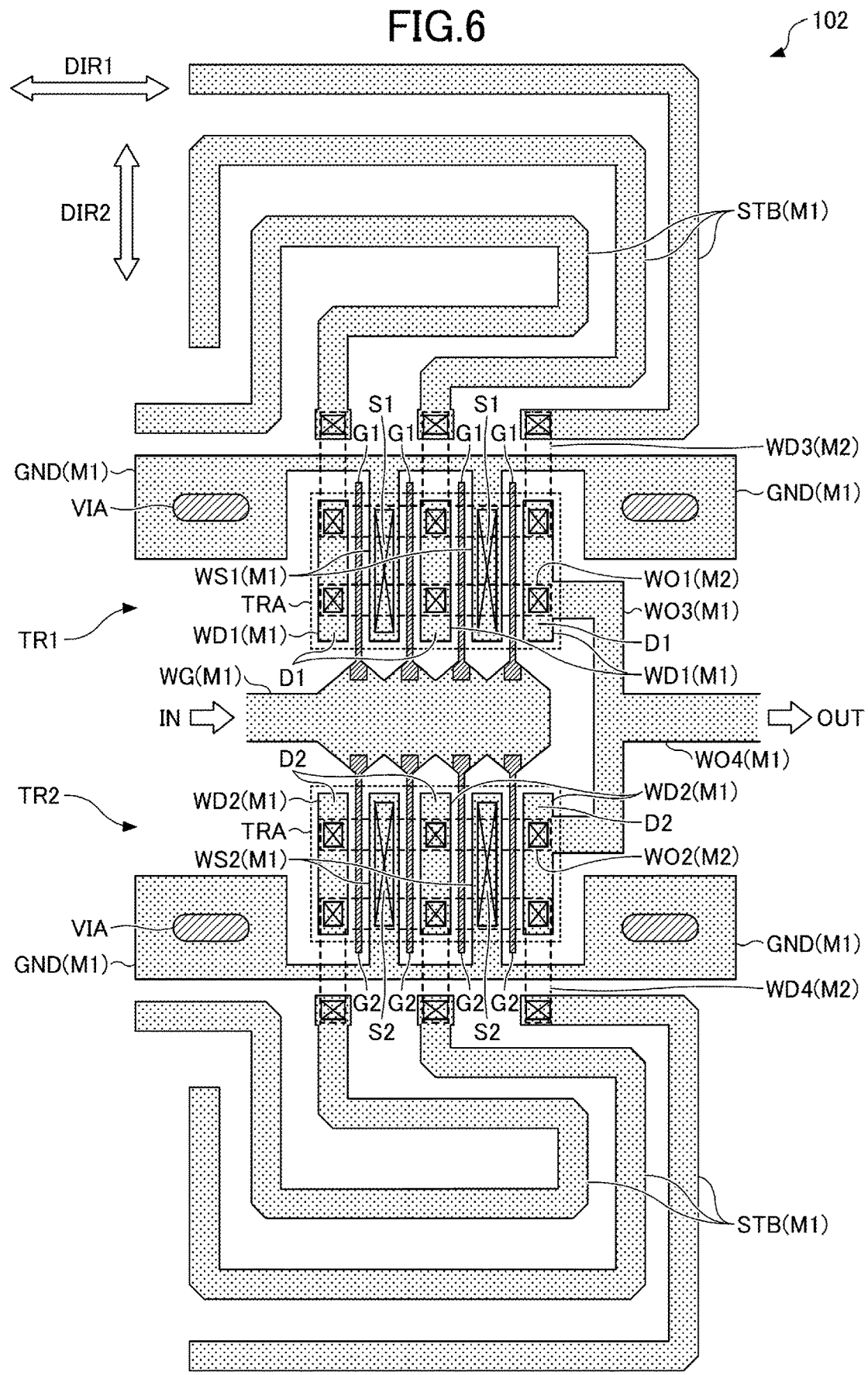
FIG. 6 is a layout diagram illustrating an example of the circuit configuration of the semiconductor device according to a second embodiment.

FIG. 6 is a layout diagram illustrating an example of the circuit configuration of the semiconductor device according to a second embodiment. In FIG. 6, elements that are the same as the elements illustrated in FIG. 1 are designated by the same reference symbols, and a detailed description of the same elements will be omitted. A semiconductor device 102 illustrated in FIG. 6 includes two transistors TR1 and TR2. The two transistors TR1 and TR2 have a layout in which the transistors TR1 and TR2 are arranged in line symmetry with respect to the gate interconnect WG which extends in the direction DIR1. In other words, the semiconductor device 102 has a so-called fish-bone type transistor structure in which the gate electrodes G1 and G2 are directly connected to both sides of the gate interconnect WG which corresponds to a backbone of the fish-bone. For example, the semiconductor device 102 includes is provided in the broadband amplifier 14 illustrated in FIG. 5, in place of the semiconductor device 100.

The transistor TR1 is the same as the transistor TR1 illustrated in FIG. 1, including the reference symbols used for the elements. The transistor TR2 is the same as the transistor TR1 illustrated in FIG. 1, except for the different reference symbols used for the elements. The transistor TR2 has four gate electrodes G2 extending in the direction DIR2. The four gate electrodes G2 are spaced apart from one another, and are connected to the gate interconnect WG. In addition, the transistor TR2 has source regions S2 and drain regions D2 which are alternately arranged along the direction DIR1, so that each of the four gate electrodes G2 is sandwiched between the source region S2 and the drain region D2 which are adjacent to each other. A drain interconnect (drain electrode) WD2 is directly connected to the drain region D2. A source interconnect (source electrode) WS2, which is connected to the ground pattern GND, is directly connected to the source region S2.

Next, a fish-bone type gate electrode, or a fish-bone type transistor, will be described. The fish-bone type refers to a structure similar to that of a fish-bone (or fish skeleton) including the backbone connecting a head and a tail fin, and thin bones such as ribs extending approximately perpendicularly from the backbone in mutually opposite directions to both sides, namely, the dorsal fin side and the abdominal fin side of the backbone. Hence, in the fish-bone type gate electrode, the gate interconnect WG is arranged at the center, and the gate electrodes G1 and G2, which correspond to the thin bones, are arranged on both sides of the gate interconnect WG, so as to sandwich the gate interconnect WG. Further, the fish-bone type transistor TR1, the source region S1 and the drain region D1 are arranged on both sides of the gate electrode G1, so as to sandwich the gate electrode G1. Similarly, in the fish-bone type transistor TR2, the source region S2 and the drain region D2 are arranged on both sides of the gate electrode G2, so as to sandwich the gate electrode G2. A gate width of the fish-bone type transistor is the sum of the widths of the respective gate electrodes connected to the gate interconnect.

Each drain interconnect WD2 is connected to an output interconnect WO2 extending in the direction DIR1. The output interconnect WO2 is connected to each drain interconnect WD2 on the side of the gate interconnect WG. The output interconnect WO2, which is connected to the drain interconnects WD2, is formed across the source interconnects WS2 and the gate electrodes G2, and is connected to the output interconnect WO3 which extends in the direction DIR2. The output interconnect WO2 enables each drain interconnect WD2 to be connected to the output interconnect WO3 at linearly arranged connection portions.

Each drain interconnect WD2 is connected to a drain interconnect WD4 which is famed using the second metal interconnect layer M2, at the end opposite from the gate interconnect WG. The drain interconnect WD4 has three protruding portions at positions corresponding to the drain interconnects WD2, and the three protruding portions protrude in an opposite direction to the gate interconnect WG across the ground pattern GND. Tip ends of the three protruding portions are connected to the open stubs STB which are formed using the first metal interconnect layer M1, respectively. The open stubs STB may be defined to include the protruding portions of the drain interconnect WD4.

One end and the other end of the output interconnect WO3 are connected to the output interconnects WO1 and WO2, respectively. A center portion of the output interconnect WO3 along the direction DIR2 is electrically connected to the output terminal OUT via an output interconnect WO4. The output interconnects WO3 and WO4 are an example of an interconnect combining part. In this embodiment, the output interconnect WO1 can be connected to one end of the output interconnect WO3, without requiring rerouting to take alternative routes around the gate electrodes G1 and the source interconnects WS1. Similarly, the output interconnect WO2 can be connected to the other end of the output interconnect WO3, without requiring rerouting to take alternative routes around the gate electrodes G2 and the source interconnects WS2.

Accordingly, it is possible to minimize the wiring resistance and the stray capacitance of the output interconnects WO1, WO2, and WO3 through which the output signals of the transistors TR1 and TR2 are transmitted, and improve the frequency characteristics of the output signals. In addition, it is possible to minimize an electrical length of the output interconnect WO3 along the direction DIR2. In particular, by arranging the output interconnects WO1 and WO2 on the side of the gate interconnect WG, it is possible to minimize the electrical length of the output interconnect WO3 along the direction DIR2. Further, because the transistors TR1 and TR2, which are connected to the output interconnects WO1, WO2, and WO3 having the minimum lengths, are formed in line symmetry with respect to the gate interconnect WG, it is possible to reduce a phase error of the output signals transmitted to the output interconnects WO1 and WO2.

As a result, it is possible to reduce the loss of output signal from the semiconductor device 102, and increase the output power of the semiconductor device 102. Further, because the output interconnects WO1 and WO2 have the airbridge interconnect structure, it is possible to reduce the stray capacitance of the interconnect, and improve the high frequency characteristics.

Figure 7:
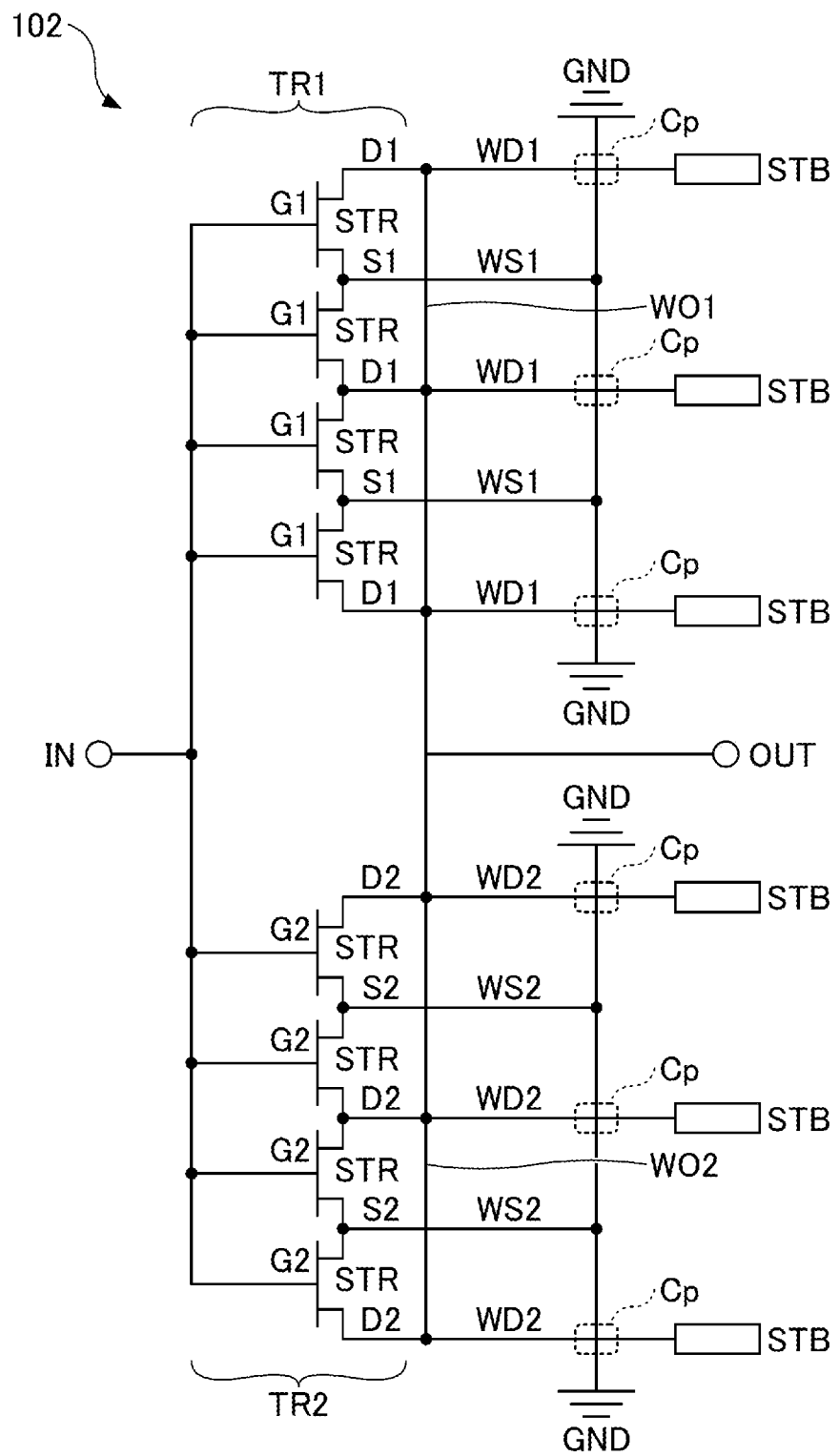
FIG. 7 is an equivalent circuit diagram of the semiconductor device illustrated in FIG. 6.

FIG. 7 is an equivalent circuit diagram of the semiconductor device 102 illustrated in FIG. 6. In FIG. 7, elements that are the same as the elements illustrated in FIG. 3 are designated by the same reference symbols, and a detailed description of the same elements will be omitted. In FIG. 7, the two transistors TR1 and TR2 are arranged in line symmetry with respect to a line connecting the input terminal IN and the output terminal OUT. Circuit elements of the transistors TR1 and TR2 are similar to the circuit elements of the transistor TR1 illustrated in FIG. 3.

In FIG. 7, similar to FIG. 3, capacitances Cp are formed between the ground pattern GND (the first metal interconnect layer M1), and the protruding portions of the drain interconnect WD3 and WD4 (the second metal interconnect layer M2) which are connected to the open stubs STB illustrated in FIG. 6, respectively. However, because the interconnect capacitances Cp all become the same, the inductances of the open stubs STB can all be made the same, and it is possible to prevent the characteristics of the transistors TR1 and TR2 from deteriorating due to the differences among the inductances of the open stubs STB.

As described above, this embodiment can obtain the same effects as the first embodiment described above. For example, by directly connecting the open stubs STB to the drain interconnects WD1 and WD2, respectively, it is possible to efficiently compensate for the drain-source capacitance of the transistors TR1 and TR2. Further, in the semiconductor device 102 having the fish-bone transistor structure according to this embodiment, it is possible to minimize the electrical length of the output interconnect WO3 along the direction DIR2, connecting the output interconnect WO1 of the transistor TR1 and the output interconnect WO2 of the transistor TR2.

As a result, it is possible to reduce the loss of the output signal, and increase the output power of the semiconductor device 102 having the frequency characteristics improved by the open stubs STB.

It is possible to further reduce the electrical length, the wiring resistance, and the stray capacitance of the output interconnect WO3, by arranging the output interconnect WO1 on at the drain interconnect WD1 on the side of the gate interconnect WG, and arranging the output interconnect WO2 at the drain interconnect WD2 on the side of the gate interconnect WG. By making the wiring length from the drain interconnect WD1 to the output interconnect WO4, and WD2 the wiring length from the drain interconnect WD2 to the output interconnect WO4, the same and also minimizing these wiring lengths, it is possible to reduce the phase error of the output signals transmitted to the output interconnect WO4 through the output interconnects WO1 and WO2.

Third Embodiment

Figure 8:
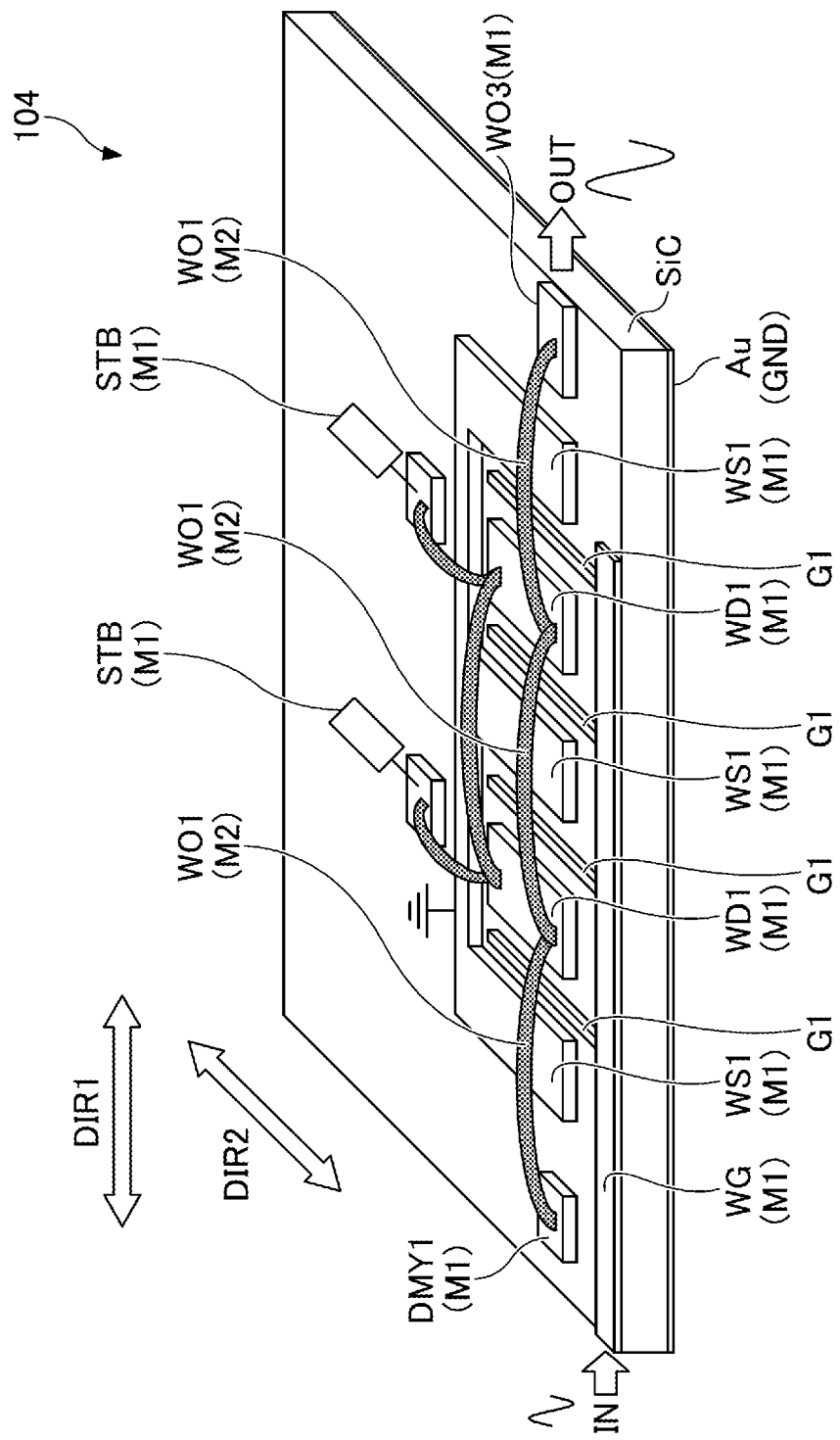
FIG. 8 is a perspective view generally illustrating the semiconductor device according to a third embodiment.

FIG. 8 is a perspective view generally illustrating the semiconductor device according to a third embodiment. In FIG. 8, elements that are the same as the elements illustrated in FIG. 2 are designated by the same reference symbols, and a detailed description of the same elements will be omitted. A semiconductor device 104 illustrated in FIG. 8 includes a dummy interconnect DMY1 arranged outside the transistor region TRA. The dummy interconnect DMY1 is arranged on one end of the output interconnect WO1, opposite from the output interconnect WO3, and extends to the outside of the transistor region TRA. For example, the dummy interconnect DMY1 is formed using the first metal interconnect layer M1, and is not connected to other than the output interconnect WO1. For example, the semiconductor device 104 is provided in the broadband amplifier 14 illustrated in FIG. 5, in place of the semiconductor device 100.

The three partial interconnects of the output interconnect WO1 illustrated in FIG. 8 have the airbridge interconnect structure, respectively. For example, a distance between the drain interconnect WD1 on the left side in FIG. 8 and the dummy interconnect DMY1, is the same as each of a distance between the two drain interconnects WD1, and a distance between the drain interconnect WD1 on the right side in FIG. 8 and the output interconnect WO3. For this reason, the three partial interconnects of the output interconnect WO1 can have a symmetrical layout including one partial interconnect extending on both sides of the direction DIR1 with respect to the two drain interconnects WD1, one partial interconnect extending from the drain interconnect WD1 on the left side in FIG. 8 towards the adjacent dummy interconnect DMY1, and one partial interconnect extending from the drain interconnect WD1 on the right side in FIG. 8 towards the adjacent output interconnect WO3.

As a result, the stray capacitance of the output interconnect WO1 connected to each drain region D1 through each drain interconnect WD1, can be made symmetrical, and the high frequency characteristics can be improved. Even in a case where an odd number of (for example, three) gate electrodes G1 are provided, and the gate electrode G1 located at the leftmost portion in FIG. 8 and the source region S1 are not formed, the dummy interconnect DMY1 is arranged at the position illustrated in FIG. 8. Further, the output interconnect WO1 is connected to the dummy interconnect DMY1. Hence, the stray capacitance by the output interconnect WO1 can be made symmetrical, regardless of the number of gate electrodes G1 provided.

As described above, this embodiment can obtain the same effects as any of the embodiments described above. For example, by directly connecting the open stubs STB to the drain interconnects WD1, respectively, it is possible to efficiently compensate for the drain-source capacitance of the transistor TR1. Further, in this embodiment, the end of the output interconnect WO1, opposite to the connection portion of the output interconnect WO1 connected to the output interconnect WO3, is connected to the dummy interconnect DMY1. Hence, the stray capacitance of the output interconnect WO1 connected to each drain region D1 through the drain interconnect WD1, can be made symmetrical, and the high frequency characteristics can be improved.

Fourth Embodiment

Figure 9:
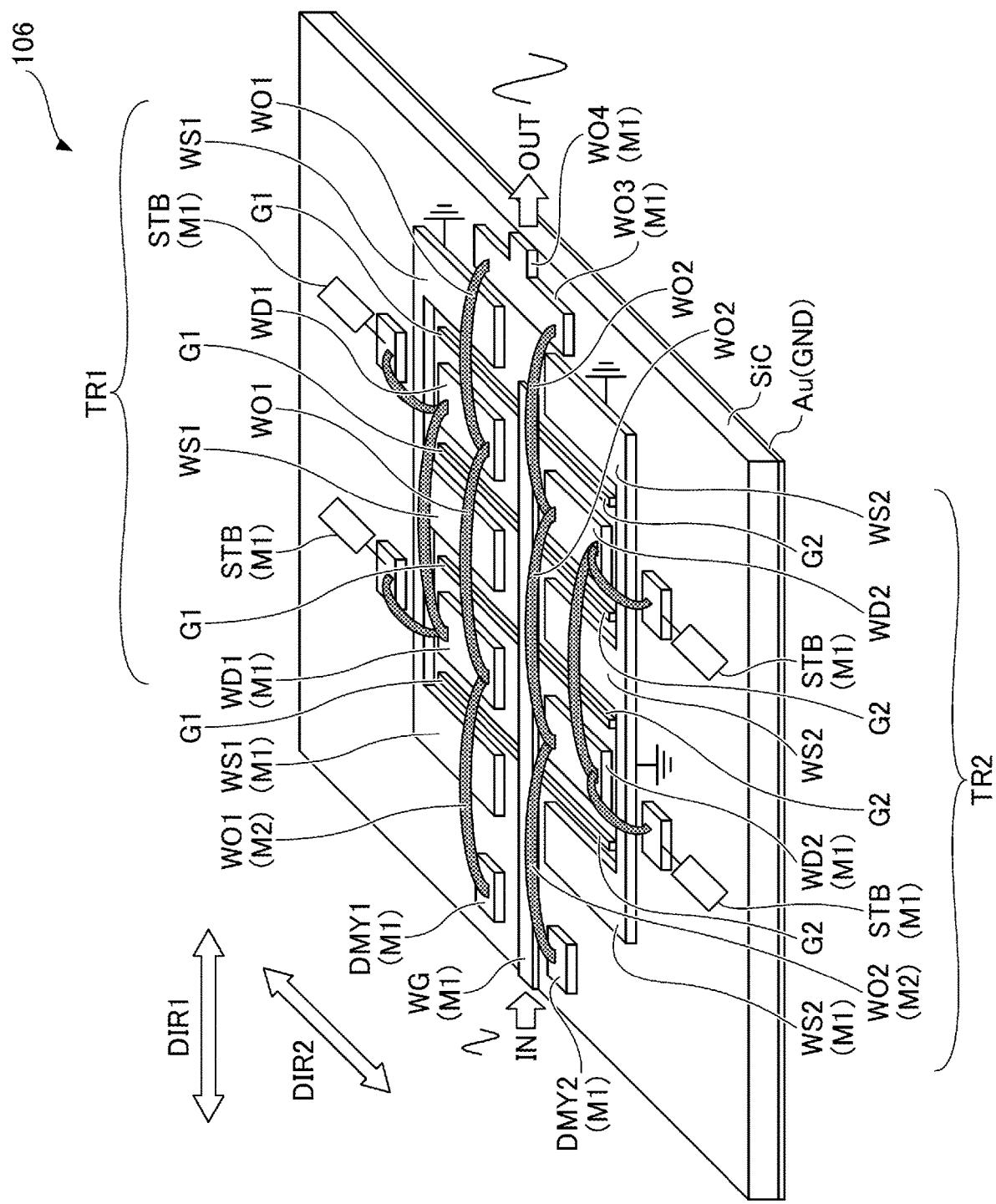
FIG. 9 is a perspective view generally illustrating the semiconductor device according to a fourth embodiment.

FIG. 9 is a perspective view generally illustrating the semiconductor device according to a fourth embodiment. In FIG. 9, elements that are the same as the elements illustrated in FIG. 2, FIG. 6, and FIG. 8 are designated by the same reference symbols, and a detailed description of the same elements will be omitted. A semiconductor device 106 illustrated in FIG. 9 has a structure similar to the structure of the semiconductor device 102 having the transistors TR1 and TR2 illustrated in FIG. 6, but includes dummy interconnects DMY1 and DMY2 connected to the output interconnects WO1 and WO2 of the semiconductor device 102, respectively. For example, semiconductor device 106 is provided in the broadband amplifier 14 illustrated in FIG. 5, in place of the semiconductor device 100. As described above, this embodiment can obtain the same effects as any of the embodiments described above.

Fifth Embodiment

Figure 10:
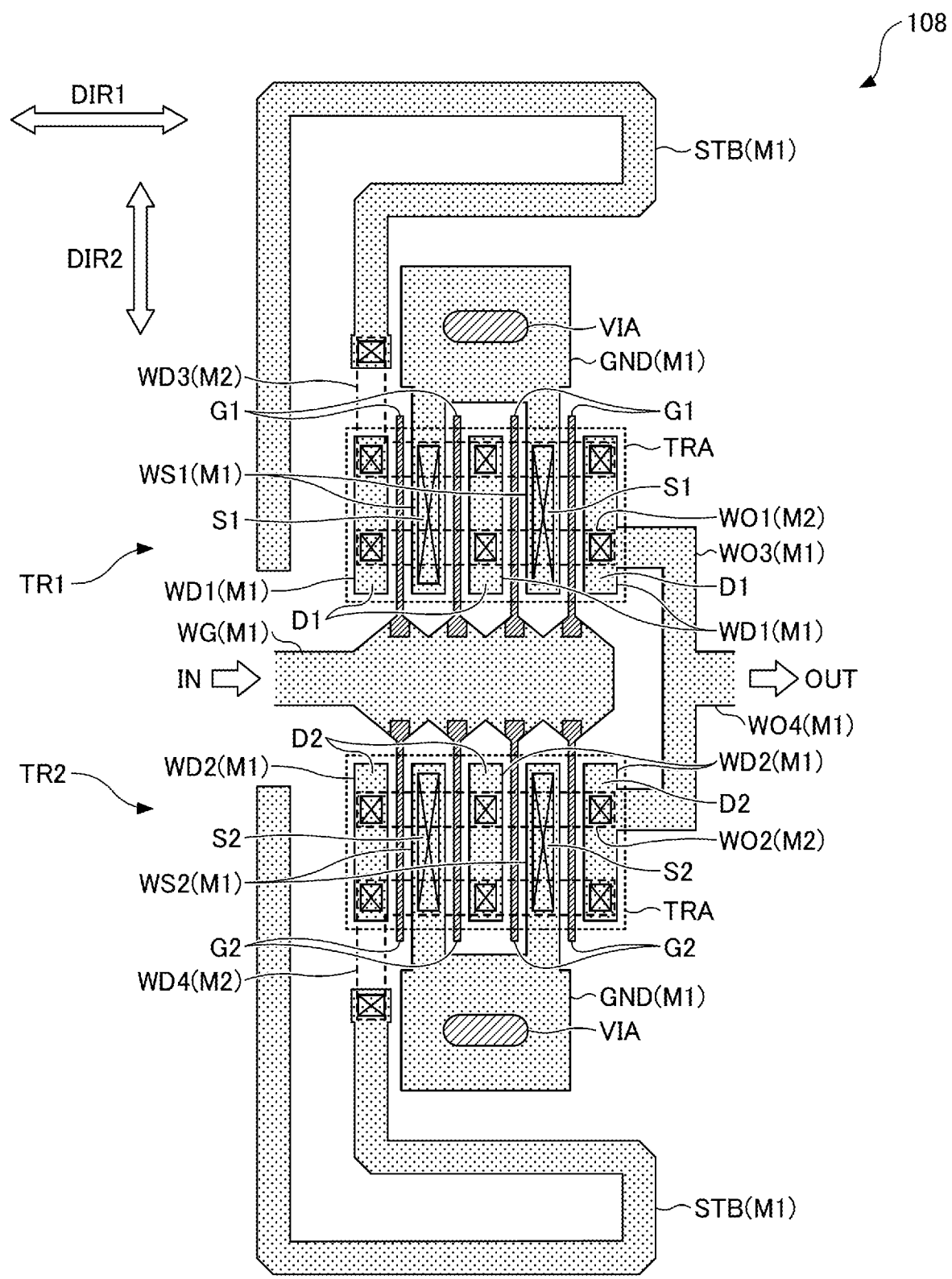
FIG. 10 is a layout diagram illustrating an example of the circuit configuration of the semiconductor device according to a fifth embodiment.

FIG. 10 is a layout diagram illustrating an example of the circuit configuration of the semiconductor device according to a fifth embodiment. In FIG. 10, elements that are the same as the elements illustrated in FIG. 1 and FIG. 6 are designated by the same reference symbols, and a detailed description of the same elements will be omitted. In a semiconductor device 108 illustrated in FIG. 10, the open stub STB is connected only to the drain interconnect WD1 located on the side opposite to the output interconnect WO3 of the transistor TR1. Similarly, the open stub STB is connected only to the drain interconnect WD2 located on the side opposite to the output interconnect WO3 in the transistor TR2. For example, the semiconductor device 108 is provided in the broadband amplifier 14 illustrated in FIG. 5, in place of the semiconductor device 100.

The open stubs STB may be connected only to the drain interconnects WD1 and WD2, respectively, located at the center. Alternatively, the open stubs STB may be connected only to the drain interconnects WD1 and WD2, respectively, located on the side of the output interconnect WO3. In addition, the open stubs STB foamed using the second metal interconnect layer M2, may be directly connected to the protruding portions of the L-shaped drain interconnects WD3 and WD4, respectively, which are also formed using the second metal interconnect layer M2. As described above, this embodiment can obtain the same effects as any of the embodiments described above.

Sixth Embodiment

Figure 11:
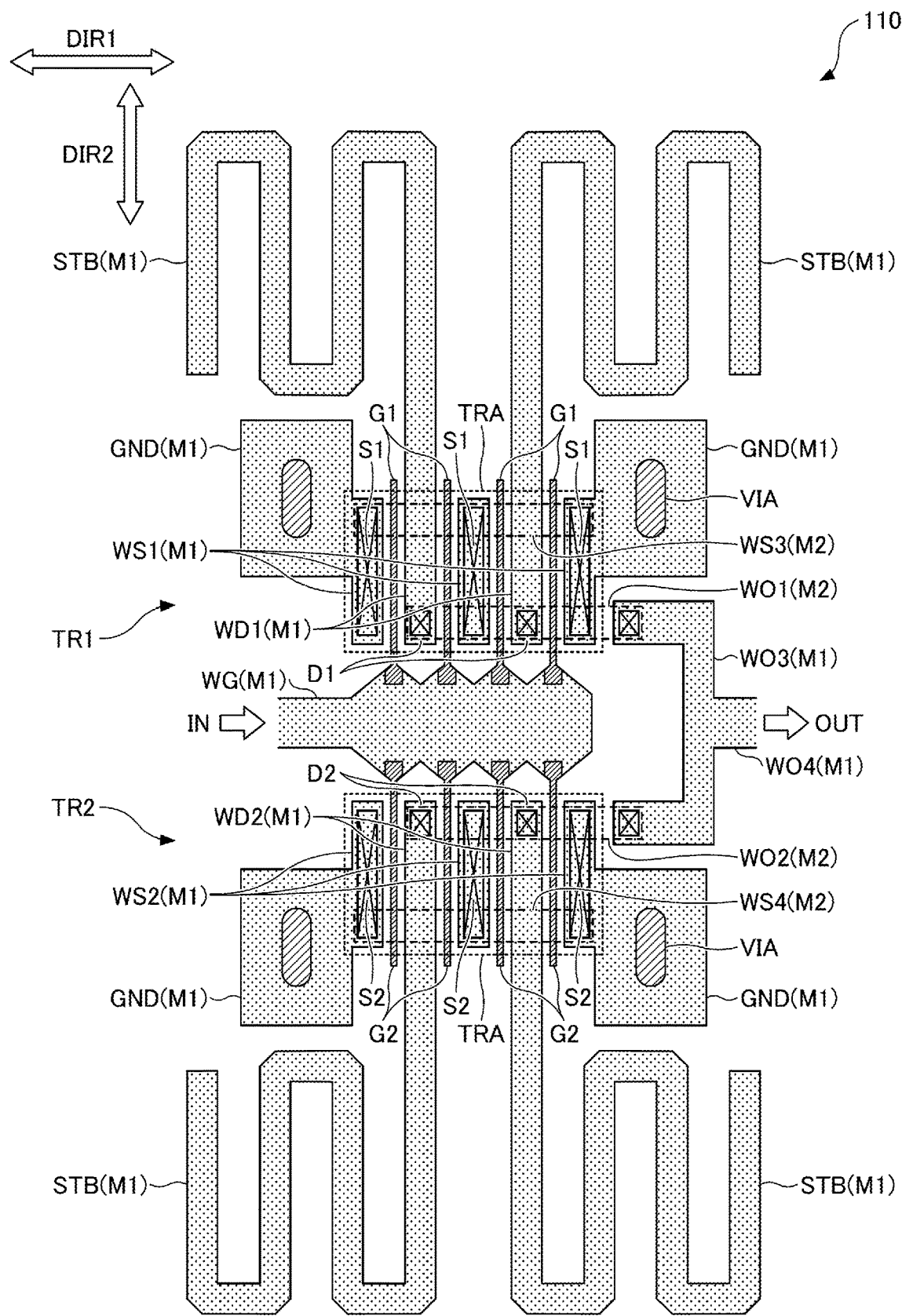
FIG. 11 is a layout diagram illustrating an example of the circuit configuration of the semiconductor device according to a sixth embodiment.

FIG. 11 is a layout diagram illustrating an example of the circuit configuration of the semiconductor device according to a sixth embodiment. In FIG. 11, elements that are the same as the elements illustrated in FIG. 1 and FIG. 6 are designated by the same reference symbols, and a detailed description of the same elements will be omitted. In a semiconductor device 110 illustrated in FIG. 11, the order in which the source regions S1 and the drain regions D1 are arranged in the transistor TR1 is different from that of FIG. 6. In addition, the order in which the source regions S2 and the drain regions D2 are arranged in the transistor TR2 is different from that of FIG. 6. FIG. 11 illustrates an example in which an even number of gate electrodes G1 and an even number of gate electrodes G2 are provided. For example, the semiconductor device 110 is provided in the broadband amplifier 14 illustrated in FIG. 5, in place of the semiconductor device 100.

In the transistor TR1, the three source regions S1 are formed at both ends and at the center along the direction DIR1, respectively. The drain interconnect WD1 arranged on each drain region D1 is directly connected to each drain region D1. The source interconnects WS1 arranged on the source regions S1 at both ends along the direction DIR1, respectively, are directly connected to the ground pattern GND.

The source interconnect WS1 arranged on the source region S1 at the center along the direction DIR1 is connected to the source interconnects WS1 at both ends along the direction DIR1, through a source interconnect WS3 extending in the direction DIR1. The source interconnect WS3 is formed using the second metal interconnect layer M2. The two drain interconnects (drain electrodes) WD1 are directly connected to the open stubs STB famed using the first metal interconnect layer M1, respectively.

In the transistor TR2, the three source regions S2 are formed at both ends and at the center along the direction DIR1, respectively. The drain interconnect WD2 arranged on each drain region D2 is directly connected to each drain region D2. The source interconnects WS2 arranged on the source regions S2 at both ends along the direction DIR1, respectively, are directly connected to the ground pattern GND.

The source interconnect WS2 arranged on the source region S2 at the center along the direction DIR1 is connected to the source interconnects WS2 at both ends along the direction DIR1, through a source interconnect WS4 extending in the direction DIR1. The source interconnect WS4 is formed using the second metal interconnect layer M2. The two drain interconnects (drain electrodes) WD2 are directly connected to the open stubs STB famed using the first metal interconnect layer M1, respectively.

In this embodiment, the source interconnect WS1 arranged at the center along the direction DIR1 is connected to the ground pattern GND, through the source interconnect WS3 formed using the second metal interconnect layer M2. The source interconnect WS2 arranged at in the center along the direction DIR1 is connected to the ground pattern GND, through the source interconnect WS4 formed using the second metal interconnect layer M2.

Hence, each open stub STB can be integrally formed on each drain interconnect WD1 or WD2, using only the first metal interconnect layer M1, without using the second metal interconnect layer M2. As a result, the layout design of the open stubs STB can be facilitated compared to the case where the second metal interconnect layer M2 is used. As described above, this embodiment can obtain the same effects as any of the embodiments described above.

Figure 12:
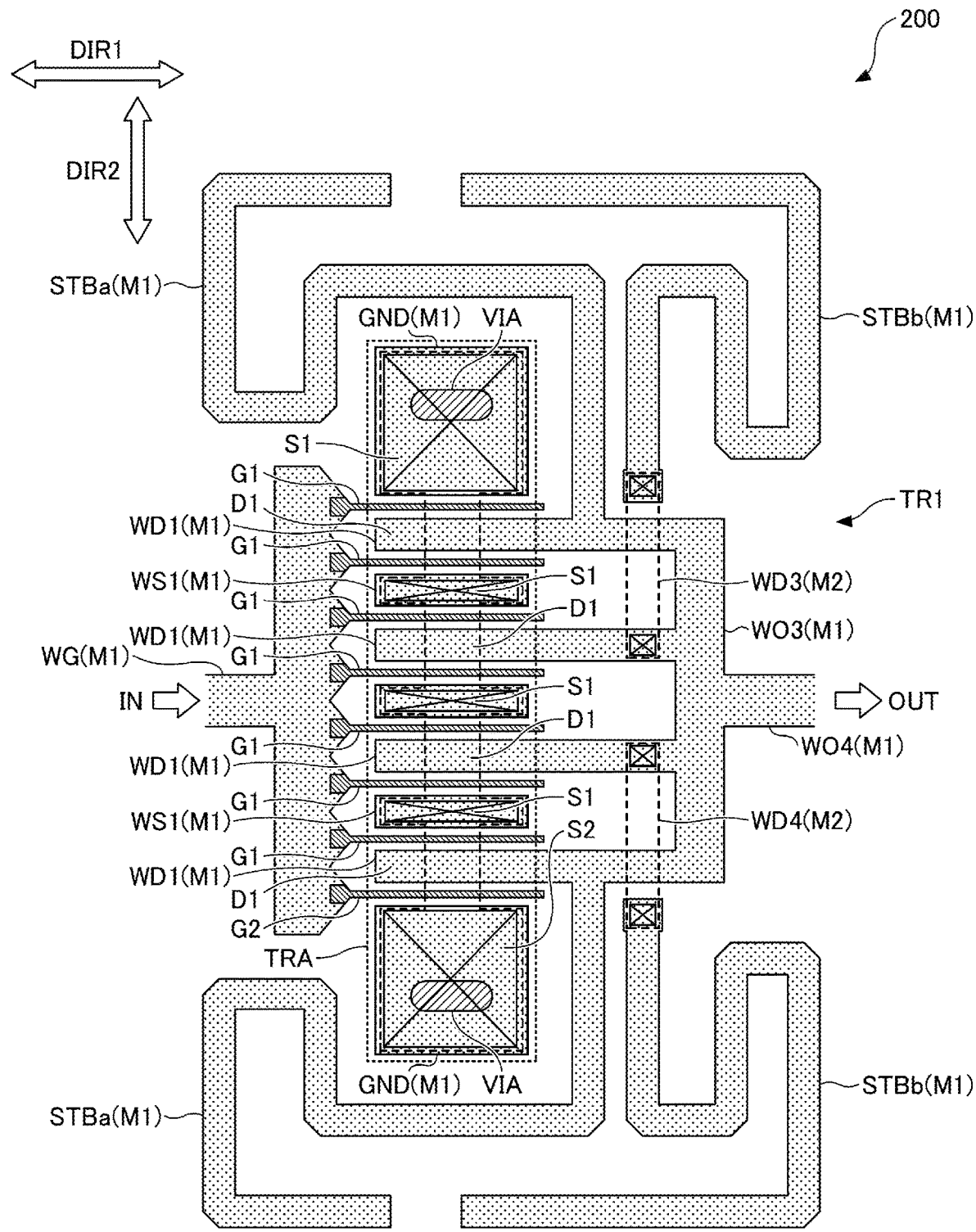
FIG. 12 is a layout diagram illustrating an example of the circuit configuration of another semiconductor device (comparative example).

FIG. 12 is a layout diagram illustrating an example of the circuit configuration of another semiconductor device (comparative example). In FIG. 12, elements that are the same as the elements illustrated in FIG. 1 and FIG. 6 are designated by the same reference symbols, and a detailed description of the same elements will be omitted. The transistor TR1 of a semiconductor device 200 illustrated in FIG. 12 has a so-called multi-finger type transistor structure. In the multi-finger type transistor TR1, a transmission direction of the input signal input to the transistor TR1, and a transmission direction of the output signal output from the transistor TR1, coincide with the direction in which the gate electrodes G1 extend.

For example, the transistor TR1 has eight gate electrodes G1 extending in the direction DIR1, and the source regions S1 are famed at both ends along the direction DIR2, respectively. The drain interconnects WD1 arranged on the four drain regions D1, respectively, and formed using the first metal interconnect layer M1, are directly connected to the output interconnect WO3 formed using the first metal interconnect layer M1.

Interconnects of the four open stubs STB (STBa and STBb) connected to the four drain interconnects WD1, respectively, are drawn from the connecting portions connecting the four drain interconnects WD1 and the output interconnect WO3. However, the open stubs STBb connected to the two drain interconnects WD1 at the center along the direction DIR2 have interconnects formed of the second metal interconnect layer M2, and formed across the output interconnect WO3 connected to the open stubs STBa.

Figure 13:
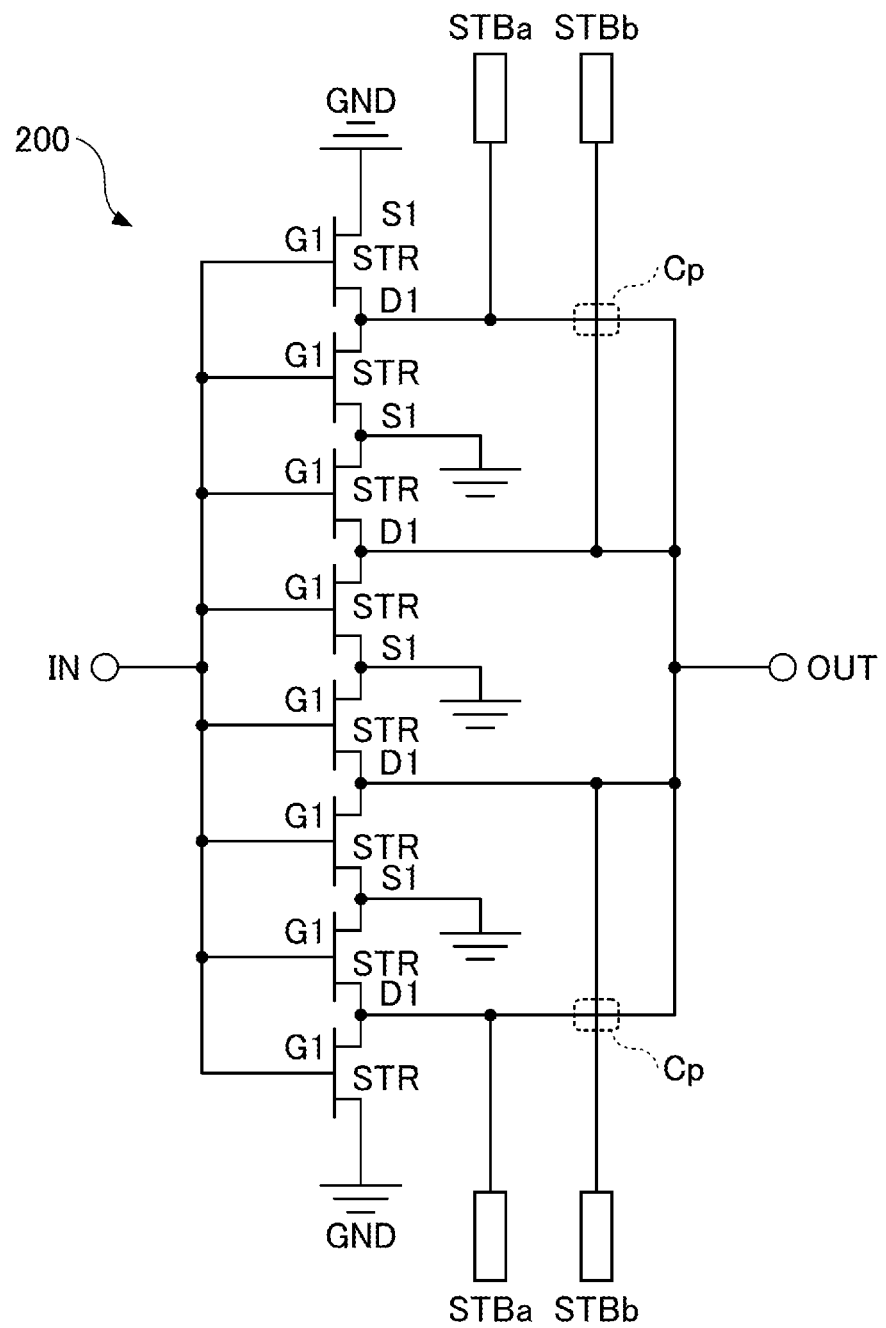
FIG. 13 is an equivalent circuit diagram of the other semiconductor device (comparative example) illustrated in FIG. 12.

FIG. 13 is an equivalent circuit diagram of the semiconductor device 200 illustrated in FIG. 12. As illustrated in FIG. 13, the open stub STBb has a surplus wiring capacitance Cp between the output interconnects WO3, with respect to the open stub STBa. For this reason, the inductance of the open stub STBb is small compared to the inductance of the open stub STBa. As a result, a difference is generated between the impedance of the subtransistor STR connected to the open stub STBb, and the impedance of the subtransistor STR connected to the open stub STBa, thereby deteriorating the frequency characteristics of the transistor TR1.

In contrast, the semiconductor devices 102, 106, 108, and 110 having the fish-bone type transistor structure illustrated in FIG. 6, FIG. 9, FIG. 10, and FIG. 11, have a structure in which the open stubs STB do not intersect other signal interconnects. For this reason, there is no difference in the inductance among the open stubs STB, and no difference is generated in the impedance among the subtransistors STR.

Accordingly, it is possible to reduce the deterioration of the frequency characteristics of the transistors TR1 and TR2.

According to the present disclosure, it is possible to provide a transistor which can compensate for the drain-source capacitance and improve the frequency characteristics, and a semiconductor device including the transistor.

The present disclosure is not limited to the specific embodiments of the semiconductor device described in detail above, and various variations, modifications, substitutions, additions, deletions, and combinations may be made within the scope of the present disclosure.

What is claimed is:

1. A semiconductor device comprising:
   a gate interconnect, extending in a first direction, and configured to transmit an input signal;
   a first transistor including
      a plurality of gate electrodes extending in a second direction perpendicular to the first direction, and spaced apart from one another in a planar layout of the semiconductor device, and connected to the gate interconnect, and
      a plurality of source regions and a plurality of drain regions which are alternately arranged along the first direction, so that each gate electrode of the plurality of gate electrodes is sandwiched between the source region and the drain region which are adjacent to each other in the planar layout of the semiconductor device;
   a plurality of drain interconnects, arranged above the plurality of drain regions, and connected to the plurality of drain regions, respectively;
   an output interconnect, connected to the plurality of drain interconnects, and configured to transmit an output signal output from the plurality of drain regions;
   a plurality of stubs connected to the plurality of drain interconnects, respectively; and
   a plurality of source interconnects arranged above the plurality of source regions, and connected to the source regions, respectively, wherein
   the plurality of drain interconnects is formed by a first metal interconnect laver,
   the plurality of stubs is formed by at least one of the first metal interconnect layer and a second metal interconnect layer provided above the first metal interconnect layer,
   at least one stub of the plurality of stubs is connected to one drain interconnect of the plurality of drain interconnects at a first end of the one drain interconnect opposite from a second end of the one drain interconnect closer to the gate interconnect along the second direction than the first end of the one drain interconnect is to the gate interconnect in the planar layout of the semiconductor device, and
   the output interconnect extends across at least one of the plurality of source interconnects and at least one of the plurality of gate electrodes of the first transistor along the first direction in the planar layout of the semiconductor device, and is connected to each of the plurality of drain interconnects.

2. The semiconductor device as claimed in claim 1, wherein the output interconnect is formed by a metal interconnect layer provided above another metal interconnect layer forming the plurality of source interconnects and the plurality of drain interconnects.

3. The semiconductor device as claimed in claim 2, further comprising:
- a second transistor having a structure identical to the first transistor, wherein the first transistor and the second transistor are arranged on both sides of the gate interconnect along the second direction in the planar layout of the semiconductor device; and
- an interconnect combining part configured to connect the output interconnect of the first transistor, connected to the plurality of drain regions through the plurality of drain interconnects of the first transistor, and an output interconnect of the second transistor, connected to a plurality of drain regions through a plurality of drain interconnects of the second transistor.

4. The semiconductor device as claimed in claim 2, wherein the plurality of stubs are connected to the plurality of the drain interconnects, respectively.

5. The semiconductor device as claimed in claim 2, further comprising:
- a dummy interconnect arranged outside of the first transistor at a first end of the output interconnect along the first direction in the planar layout of the semiconductor device, opposite a second end of the output interconnect toward which the output signal is transmitted in the output interconnect,
- wherein the second end of the output interconnect extends to the outside of the first transistor and connects to the dummy interconnect.

6. The semiconductor device as claimed in claim 2, wherein each stub of the plurality of stubs is routed without intersecting other signal interconnects.

7. The semiconductor device as claimed in claim 6, wherein a wiring length, a wiring width, and a wiring material of the plurality of stubs are respectively the same among the plurality of stubs.

8. The semiconductor device as claimed in claim 2, wherein the output interconnect is arranged at a position closer to the gate interconnect along the second direction than to the plurality of stubs in the planar layout of the semiconductor device.

9. The semiconductor device as claimed in claim 1, further comprising:
- a substrate having a nitride layer provided on a first surface thereof,
- wherein the first metal interconnect layer is provided on the nitride layer of the substrate.

10. The semiconductor device as claimed in claim 9, further comprising:
- a first ground pattern provided on a second surface of the substrate opposite to the first surface;
- a plurality of source interconnects arranged above the plurality of source regions, and connected to the source regions, respectively; and
- a second ground pattern formed by the first metal interconnect layer integrally forming the plurality of source interconnects,
- wherein the first ground pattern and the second ground pattern are connected through vias located at positions near a first side of the first transistor, opposite to a second side of the first transistor closer to the gate electrode along the second direction than the first side, in the planar layout of the semiconductor device.

* * * * *